United States Patent [19]
Maeda

[11] Patent Number: 6,104,275
[45] Date of Patent: Aug. 15, 2000

[54] MAGNETORESISTIVE ELEMENT

[75] Inventor: Atsushi Maeda, Osaka, Japan

[73] Assignee: Sanyo Electric Co., Ltd., Osaka, Japan

[21] Appl. No.: 09/147,845

[22] PCT Filed: Sep. 16, 1997

[86] PCT No.: PCT/JP97/03270

§ 371 Date: Mar. 18, 1999

§ 102(e) Date: Mar. 18, 1999

[87] PCT Pub. No.: WO98/12758

PCT Pub. Date: Mar. 26, 1998

[30] Foreign Application Priority Data

Sep. 20, 1996 [JP] Japan ................................ 6-249437

[51] Int. Cl.[7] .................................................. H01L 43/06
[52] U.S. Cl. .................................. 338/32 R; 360/113
[58] Field of Search ...................... 338/32 R; 360/113; 324/207.21

[56] References Cited

U.S. PATENT DOCUMENTS

| | | | |
|---|---|---|---|
| 4,639,806 | 1/1987 | Kira et al. | 360/113 |
| 4,800,457 | 1/1989 | Kryder et al. | 360/113 |
| 5,206,590 | 4/1993 | Dieny et al. | 324/252 |
| 5,357,388 | 10/1994 | Smith | 360/113 |
| 5,654,566 | 8/1997 | Johnson | 360/113 |
| 5,876,843 | 3/1999 | Ishiwata | 360/113 |
| 5,910,869 | 6/1999 | Fedeli | 360/113 |

FOREIGN PATENT DOCUMENTS

| | | |
|---|---|---|
| 7-262533 | 10/1995 | Japan. |
| 8-77517 | 3/1996 | Japan. |
| 8-77519 | 3/1996 | Japan. |
| 8-87722 | 4/1996 | Japan. |
| 8-221719 | 8/1996 | Japan. |
| 9-148651 | 6/1997 | Japan. |

OTHER PUBLICATIONS

"Physical Priciples of the Bipolar Spin Transistor," Mark Johnson, Naval Research Lab., vol. 19, No. 3, 1995, pp. 684–691.

*Primary Examiner*—Karl Easthom
*Attorney, Agent, or Firm*—Arent Fox Kintner Plotkin & Kahn, PLLC

[57] ABSTRACT

A magnetoresistive element is obtained which can exhibit a larger MR change than conventional.

The magnetoresistive element is characterized as comprising a multilayer film 3 having a multilayer structure in which a nonmagnetic conductive layer 5 is interposed between a pair of ferromagnetic layer 4, 6, a pair of electrodes 7, 8 which produces a detection current flow through the multilayer film 3, and filter layers 1, 2 comprised of ferromagnetic material and disposed between at least one of the pair of ferromagnetic layers and the electrodes 7, 8 for delivering spin-polarized electrons to the ferromagnetic layers 4, 6, and characterized that a traveling distance of electrons in the ferromagnetic layers 4, 6 is maintained shorter than a spin diffusion length.

10 Claims, 14 Drawing Sheets

(a)

(b)

(a)

(b)

(a)

(b)

(c)

(d)

(e)

(f)

(g)

(h)

(i)

(j)

(k)

(l)

(a)

(b)

(c)

(d)

(e)

(f)

(g)

(a)

(b)

(a)

(b)

MAGNETORESISTIVE ELEMENT

TECHNICAL FIELD

The present invention relates to a magnetoresistive element, more particularly to en element which exhibits a so-called, giant magnetoresistive effect.

BACKGROUND ART

A magnetoresistive element (MR element) is an element which detects magnetic field changes on the basis of a magnetoresistive effect that produces changes in electrical resistance as a magnetic field varies. For a high detection sensitivity of such a magnetoresistive element, its application to reproduce heads for magnetic recording media, such as a hard disc, has been expected. However, technology has shown the continuous growth of recording density in hard discs. For application of the magnetoresistive element to reproduce heads for further improved high density recording media, it will likely need to exhibit a still higher sensitivity. If the magnetoresistive element is to increase in sensitivity, its MR ratio must be raised. In the attempt to obtain a magnetoresistive element exhibiting a high MR ratio, a giant magnetoresistive element (GMR element) has been investigated which utilizes a magnetoresistive film having a multilayer structure consisting of a ferromagnetic layer and a nonmagnetic conductive layer. As a result, a variety of GMR element designs has been proposed heretofore. Known GMR element designs include, for example, a coercivity differential type GMR element of a structure having a nonmagnetic conductive layer interposed between a pair of ferromagnetic layers having different coercive forces; a spin-valve type GMR element having a nonmagnetic conductive layer interposed between a pair of ferromagnetic layers one of which pins an antiferromagnetic layer thereon; and an artificial lattice type GMR element consisting of ferromagnetic layers and nonmagnetic conductive layers repeatedly stacked in plural periodic sequences.

However, in order to achieve a further improvement in recording density, GMR elements need to have further higher MR ratios. The development of GMR elements which permit the use of a narrow track width has been also demanded.

An object of the present invention is directed toward meeting the needs as sought heretofore and resides in its provision of a novel structure of a magnetoresistive element which can exhibit a higher MR ratio than conventional.

DISCLOSURE OF THE INVENTION

A magnetoresistive element of the present invention is characterized as including a multilayer film having a multilayer structure in which a nonmagnetic conductive layer is interposed between a pair of ferromagnetic layers, a pair of electrodes for producing a detection current flow through the multilayer film, and a filter layer of ferromagnetic material interposed between a positive one of the pair of electrodes and one of the pair of ferromagnetic layers for delivering spin-polarized electrons to the ferromagnetic layer, and is characterized that a traveling distance of electrons in the ferromagnetic layer is shorter than a spin diffusion length.

In the present invention, the spin diffusion length refers to an average distance the spin-polarized electrons can travel diffusively. In the present invention, since the traveling distance of electrons in the ferromagnetic layer, to which the spin-polarized electrons are delivered, is maintained shorter than the spin diffusion length, the electrons in the ferromagnetic layer is moveable while in a spin polarization state.

Also in the present invention, between the pair of electrodes, the positive electrode refers to an electrode from which electrons flow. The present invention requires that one filter layer be minimally provided between the positive electrode and the ferromagnetic layer on a positive side. In a more preferred embodiment, an additional filter layer may be provided between a negative electrode and the ferromagnetic layer on a negative side.

The following explains a principle on the basis of which a magnetoresistive element of the present invention exhibits a higher MR ratio than conventional magneto-resistive elements.

FIG. 1 is a sectional view, showing one embodiment of a magnetoresistive element in accordance with the present invention. Placed centrally on a substrate 9 is a multilayer film 3 consisting of a first ferromagnetic layer 4, a nonmagnetic conductive layer 5 and a second ferro-magnetic layer 6. The first ferromagnetic layer 4 is formed typically of NiFe and the second ferromagnetic layer 6 typically of Co, so that they are formed of ferromagnetic layer materials having coercive forces different in magnitude from each other. The nonmagnetic conductive layer 5 is formed typically of Cu. Accordingly, the multilayer film 3 constitutes a coercivity differential type GMR multilayer film.

Filter layers 1 and 2 are deposited on the substrate to interpose therebetween the multilayer film 3, so that they directly contact with the respective sides of the multilayer film 3. The filter layers 1 and 2 are made of ferromagnetic material such as Fe. Electrodes 7 and 8, typically of Au, are provided on the filter layers 1 and 2, respectively. These electrodes 7 and 8 produce a detection current which flows through the multilayer film 3. Electrodes for measurement of a voltage across the multilayer film 3 may be served by those electrodes 7 and 8, or separately provided.

In the magnetoresistive element embodiment shown in FIG. 1, the filter layers 1 and 2 are disposed in direct contact with respective sides of the first and second ferromagnetic layers 4 and 6 of the multilayer film 3. This is distinct from conventional magnetoresistive elements which place electrodes, bias layers or the others in the positions of those filter layers 1 and 2.

FIGS. 15 and 16 are views, illustrating a spin polarization state of electrons in each layer of a conventional magnetoresistive element. As shown in FIG. 15(a), the conventional magnetoresistive element has conductive layers 17 and 18, such as electrodes or bias layers, at opposite sides of the GMR multilayer film 3. Thus, electrons enter the -GMR multilayer film 3 through the conductive layer 17 or 18.

FIG. 15(b) illustrates a spin polarization state of electrons in each layer shown in FIG. 15(a). The spin polarization states 14, 15 and 16 correspond to those of the first ferromagnetic layer 4, nonmagnetic conductive layer 5 and second ferromagnetic layer 6, respectively. Also, the spin polarization states 19 and 20 correspond to those of the conductive layers 17 and 18, respectively.

FIG. 15 illustrates the case where the magnetization direction of the first ferromagnetic layer 4 is set parallel to the magnetization direction of the second ferromagnetic layer 6. As shown in FIG. 15(b), electrons in the nonmagnetic conductive layer 5 and conductive layers 17 and 18 of the GMR multilayer film 3 are not spin-polarized. In contrast, electrons in the first and second ferromagnetic layers 4 and 6 are spin-polarized. In addition, Fermi electrons in the first and second ferromagnetic layers 4 and 6 are spin-polarized in the same direction.

Six conduction paths are considered to allow passage of electrons through the GMR multilayer film 3, as shown in Table 1. A conduction path through the first ferromagnetic layer 4 is denoted by F1, a conduction path through the nonmagnetic conductive layer 5 by C and a conduction path through the second ferromagnetic layer 6 by F2. If resistances of the first ferromagnetic layer 4, nonmagnetic conductive layer 5 and second ferromagnetic layer 6 are given by R1, Rc and R2, respectively, a resistance of each conduction path is taken to have the form shown in Table 1.

TABLE 1

| No. | CONDUCTION PATH | NUMBER OF CONDUCTIVE LAYERS | RESISTANCE |
| --- | --- | --- | --- |
| 1-A | F1 | 1 | R1 |
| 1-B | C | 1 | Rc |
| 1-C | F2 | 1 | R2 |
| 2-A | F1, C | 2 | R1Rc/(R1 + Rc) |
| 2-B | C, F2 | 2 | RcR2/(Rc + R2) |
| 3 | F1, C, F2 | 3 | R1RcR2/(R1Rc + RcR2 + R2R1) |

Among the conduction paths given in Table 1, the conduction path No. 3 in which electrons flow through three layers exhibits the lowest resistance to actually govern the electron conduction.

FIG. 16 illustrates the spin polarization when the magnetization direction of the second ferromagnetic layer 6 is inverted to orient antiparallel to the magnetization direction of the first ferromagnetic layer 4. As shown in FIG. 16(a), the magnetization direction of the second ferromagnetic layer 6 is now set antiparallel to the magnetization direction of the first ferromagnetic layer 4. In such a situation, the spin polarization state of Fermi electrons in the first ferromagnetic layer 4 is different from that of Fermi electrons in the second ferromagnetic layer 6, as shown by the spin polarization states 14 and 16 in FIG. 16(b). In this situation, no electron is allowed to flow in the conduction path No. 3 through the three layers, as shown in Table 2.

TABLE 2

| No. | CONDUCTION PATH | NUMBER OF CONDUCTIVE LAYERS | RESISTANCE |
| --- | --- | --- | --- |
| 1-A | F1 | 1 | R1 |
| 1-B | C | 1 | Rc |
| 1-C | F2 | 1 | R2 |
| 2-A | F1, C | 2 | R1Rc/(R1 + Rc) |
| 2-B | C, F2 | 2 | RcR2/(Rc + R2) |
| 3 | F1, C, F2 | 3 | — |

This results in the increased resistance of the GMR multilayer film 3.

As described above, for the conventional magnetoresistive element, the conduction path through the three layers fails to contribute to electron conduction, if the magnetization directions of the pair of ferromagnetic layers are set antiparallel to each other. On the basis of the resistance change caused by this antiparallel orientation of the magnetization, the conventional magnetoresistive element detects a magnetic field change.

FIGS. 2 and 3 illustrate spin polarization state of electrons in each layer of the magnetoresistive element embodiment of the present invention as shown in FIG. 1. Where the magnetization direction of the first ferromagnetic layer 4 is parallel to that of the second ferromagnetic layer 6, as shown in FIG. 2(b), the spin polarization state 14 of the first ferromagnetic layer 4 is substantially equivalent to the spin polarization state 16 of the first ferromagnetic layer 6, i.e., Fermi electrons in the two layers are spin-polarized in the same direction. The respective spin polarization states 11 and 12 of the filter layers 1 and 2, composed of ferromagnetic material and disposed at opposite sides of the GMR multilayer film 3, are also substantially equivalent to each other, i.e., Fermi electrons in the two layers are spin-polarized in the same direction. In such a condition, six conduction paths are considered to allow passage of electrons, as analogous to the conventional magnetoresistive element shown in FIG. 15. Among these conduction paths, the conduction path No. 3 through the three layers exhibits the lowest resistance to actually govern the electron conduction.

TABLE 3

| No. | CONDUCTION PATH | NUMBER OF CONDUCTIVE LAYERS | RESISTANCE |
| --- | --- | --- | --- |
| 1-A | F1 | 1 | R1 |
| 1-B | C | 1 | Rc |
| 1-C | F2 | 1 | R2 |
| 2-A | F1, C | 2 | R1Rc/(R1 + Rc) |
| 2-B | C, F2 | 2 | RcR2/(Rc + R2) |
| 3 | F1, C, F2 | 3 | R1RcR2/(R1Rc + RcR2 + R2R1) |

FIG. 3 illustrates the magnetization direction of the second ferromagnetic layer 6 oriented antiparallel to the magnetization direction of the first ferromagnetic layer 4. As shown in FIG. 3(b), the spin polarization state 16 of the second ferromagnetic layer 6 is different from the spin polarization state 14 of the first ferromagnetic layer 4, as well as from the respective spin polarization states 11 and 12 of the filter layers 1 and 2, that is, the spin polarization of Fermi electrons in the second ferromagnetic layer 6 is caused to orient in a direction different from the spin polarization of Fermi electrons in the filter layers 1 and 2, as well as from the spin polarization of Fermi electrons in the first ferromagnetic layer 4. This prohibits electrons in the filter layer 1 or 2 from flowing into the second ferromagnetic layer 6. As a result, three conduction paths associated with the conduction path F2 passing through the second ferromagnetic layer 6, i.e., conduction path Nos. 1-C, 2-B and 3 are all shut off, resulting in the marked increase in resistance relative to the conventional.

TABLE 4

| No. | CONDUCTION PATH | NUMBER OF CONDUCTIVE LAYERS | RESISTANCE |
| --- | --- | --- | --- |
| 1-A | F1 | 1 | R1 |
| 1-B | C | 1 | Rc |
| 1-C | F2 | 1 | — |
| 2-A | F1, C | 2 | R1Rc/(R1 + Rc) |
| 2-B | C, F2 | 2 | — |
| 3 | F1, C, F2 | 3 | — |

As mentioned above, in accordance with the present invention, the spin-polarized electrons are delivered to one of the ferromagnetic layers. Accordingly, if the spin polarization of Fermi electrons in this ferromagnetic layer is caused to orient in a direction different from the spin polarization of the filter layer, the increased resistance results, so that an MR change greater in magnitude than conventional can be obtained. In this manner, the present invention utilizes movement of spin-polarized electrons in the ferromagnetic layer. Therefore, the traveling distance of electrons in the ferromagnetic layer, positioned in contact with the filter layer to receive therefrom spin-polarized electrons, is maintained shorter than the spin diffusion length, as stated earlier. Specifically, a size of the ferromagnetic layer extending in a direction of movement of electrons is adjusted within a predetermined range. The spin diffusion length, as used in the present invention, refers to the spin diffusion length at an operating temperature of the magnetoresistive element. Since the spin diffusion length varies depending upon the material type of the ferromagnetic layer used, thin film-forming condition selected and the others, these factors must be taken into account when determining the size of ferromagnetic layer. The traveling distance of electrons in this ferromagnetic layer corresponds to a width dimension of a field-sensing portion. Also in the case where the magnetoresistive element of the present invention is used as a magnetoresistive head (MR head), it corresponds to a track width of the MR head. In the present invention, the width of field-sensing portion is thus designed smaller in dimension than the spin diffusion length. Accordingly, the use of the present magnetoresistive element as an MR head leads to reduction in dimension of a track width of such an MR head, which makes it applicable to an MR head suitable for high density reproducing. The width of such a field-sensing portion, i.e., the traveling distance of electrons in the ferromagnetic layer is generally determined within an approximate range of $1\mu m$–$0.05\ \mu m$.

Any magnetic material can be utilized to form the ferromagnetic layer, as long as it is applicable to the GMR multilayer film. Useful magnetic materials include NiFe, Fe, Co, and alloys thereof, for example. Illustrative materials used to form the nonmagnetic conductive layer include Cu and Ag.

Also in the present invention, any ferromagnetic material which has a Curie point above a room temperature can be used to form the filter layer. Specific examples of ferromagnetic materials include NiFe, Fe, Co and alloys thereof. The ferromagnetic material may be suitably selected, so that a difference in Fermi level between the ferromagnetic layer, positioned in contact with the filter layer for receiving spin-polarized electrons therefrom, and the filter layer is maintained preferably within the range of ±1 eV, more preferably within the range of ±0.5 eV. The ferromagnetic material used to form the other of the pair of ferromagnetic layers may also be utilized to form the filter layer.

In the present invention, a major roll of the filter layer is to function as a filter to collect particularly oriented spin-polarized electrons for delivery to the ferromagnetic layer.

The multilayer film in the present invention is not particularly specified, as long as it has a multilayer structure in which a pair of ferromagnetic layers interpose therebetween a nonmagnetic conductive layer. It may be a coercivity differential type magnetoresistive film including a pair of ferromagnetic layers having coercive forces different in magnitude from each other, or a spin valve type magnetoresistive film carrying an antiferromagnetic layer on one of a pair of ferromagnetic layers, for example. In the case of spin valve type magnetoresistive film, the antiferromagnetic layer placed on one of the pair of ferromagnetic layers may be formed of FeMn, NiMn, IrMn, NiO, CoO, or NiCoO, for example.

Also, the multilayer film of the present invention may be an artificial lattice type magnetoresistive film having ferromagnetic and nonmagnetic conductive layers repeatedly stacked in plural periodic sequences. Known as such an artificial lattice type magnetoresistive film is a multilayer film consisting of Co layers, as the ferromagnetic layers, alternating with Cu layers as the nonmagnetic conductive layers.

In the magnetoresistive element of the present invention, the filter layer may be disposed in contact with each side of every layer of the multilayer film, as shown by the embodiment in FIG. 1, or alternatively, disposed in contact with each side of only one of the pair of ferro-magnetic layers. Also, the filter layer may be disposed only at one side of the multilayer film from which side carrier electrons are injected. In such a case, a conductive layer may be disposed at the other side of the multilayer film.

Also, the filter layer may be constructed such that it contacts with one of the pair of ferromagnetic layers while integrally formed with the other of the pair of ferromagnetic layers. That is, the same material can be used to continuously form the filter layer and the other of the pair of ferromagnetic layers.

BEST MODES FOR PRACTICING THE INVENTION

Figure 1:
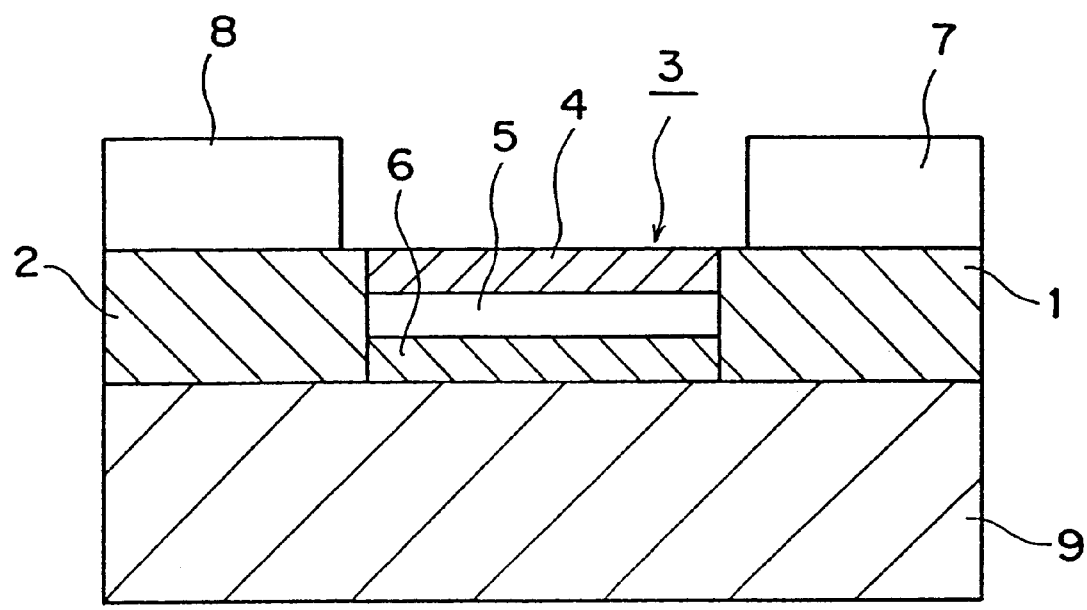
FIG. 1 is a sectional view, illustrating one embodiment of magnetoresistive element in accordance with the present invention.
Figure 2:
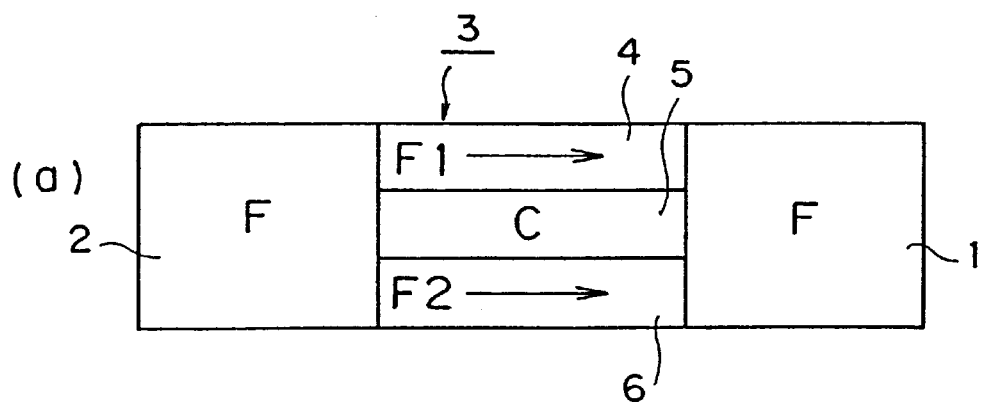
FIG. 2 are views, illustrating a spin polarization state of each layer in the magnetoresistive element of the present invention when a pair of ferromagnetic layers are magnetized in directions parallel to each other.
Figure 2:
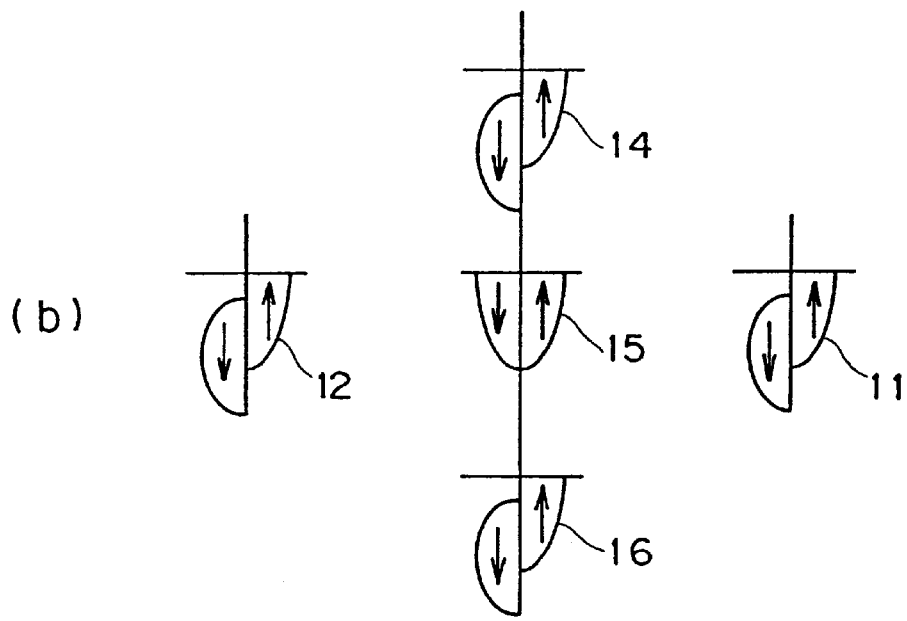
Figure 3:
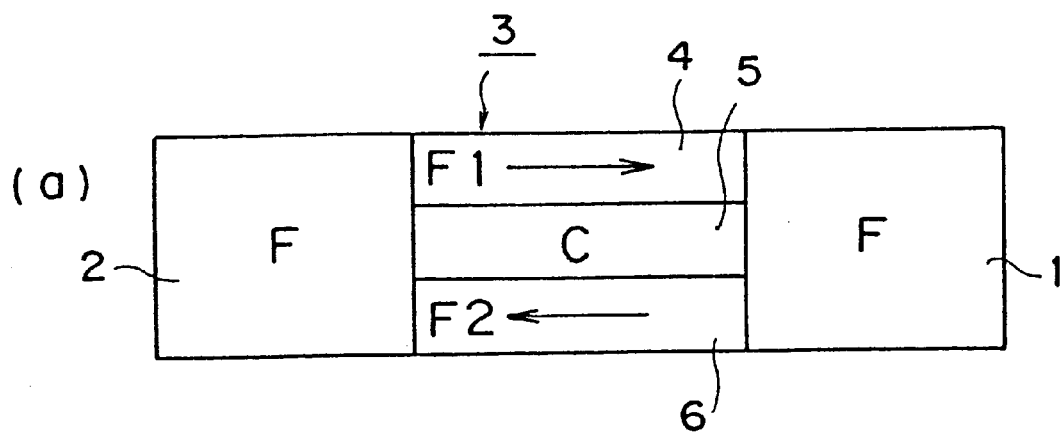
FIG. 3 are views, illustrating a spin polarization state of each layer in the magnetoresistive element of the present invention when the pair of ferromagnetic layers are magnetized in directions antiparallel to each other.
Figure 3:
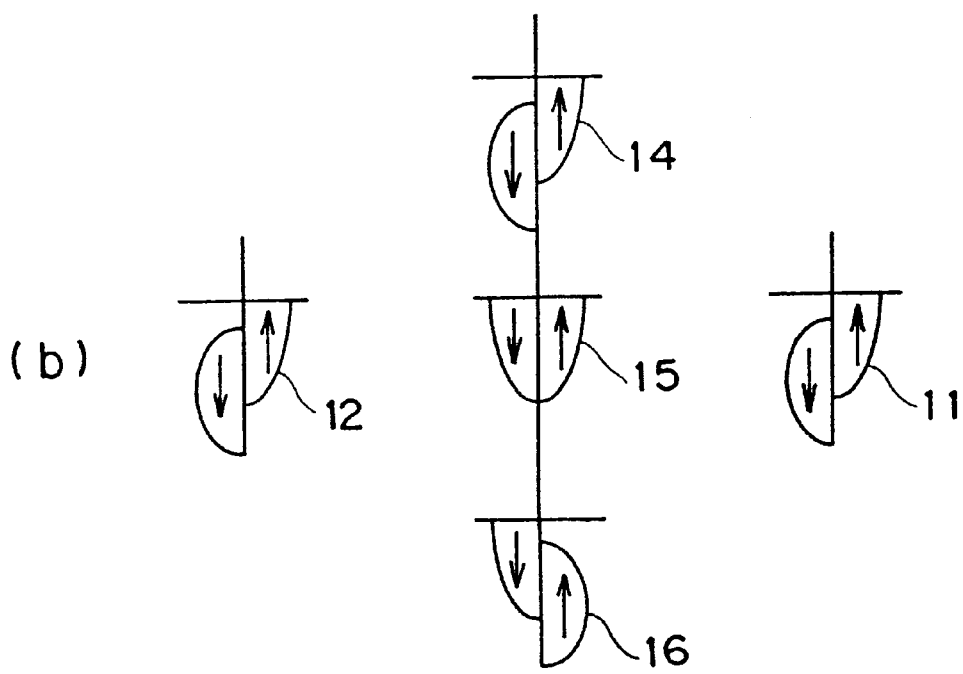
Figure 4:
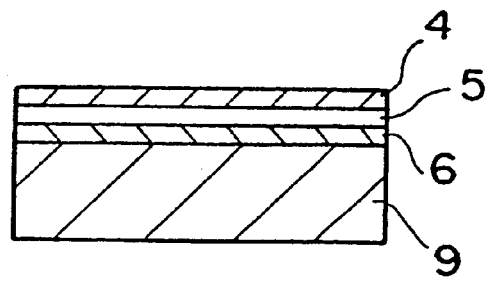
FIG. 4 are sectional views, illustrating steps of manufacturing the embodiment shown in FIG. 1.
Figure 4:
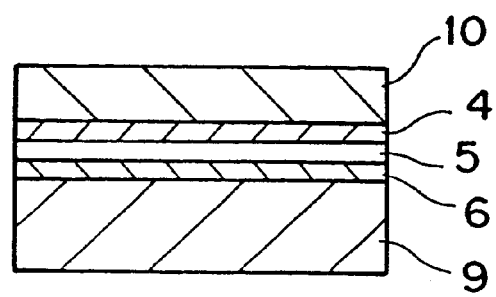
Figure 4:
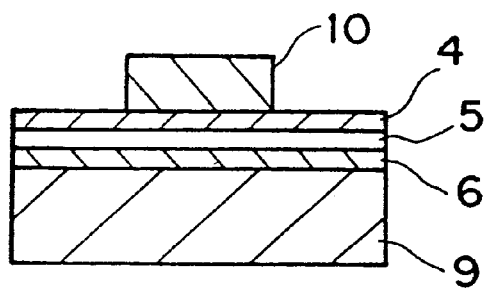
Figure 4:
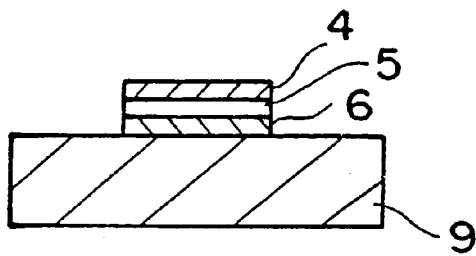
Figure 5:
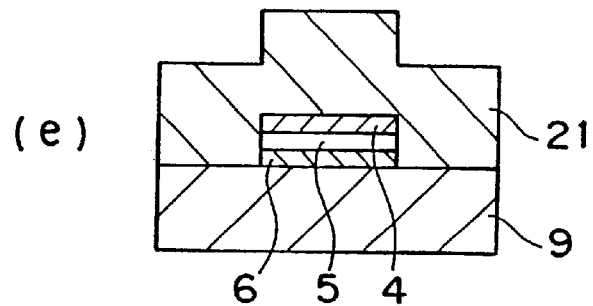
FIG. 5 are sectional views, illustrating steps of manufacturing the embodiment shown in FIG. 1.
Figure 5:
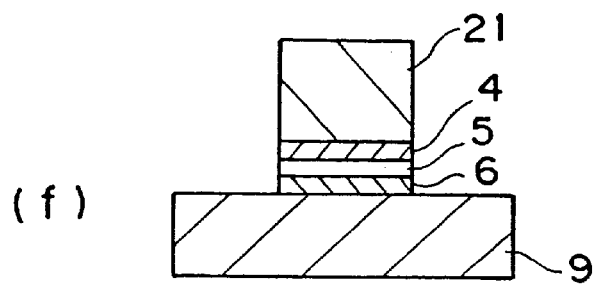
Figure 5:
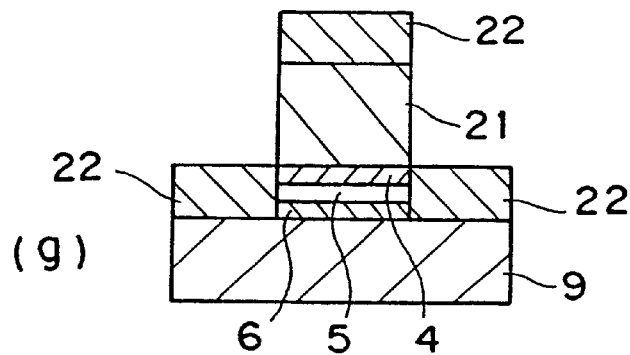
Figure 5:
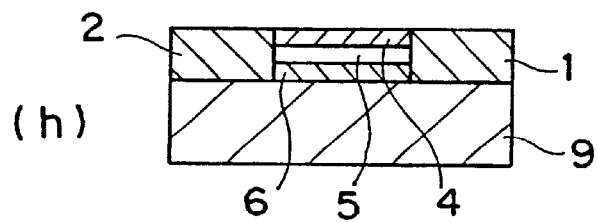
Figure 6:
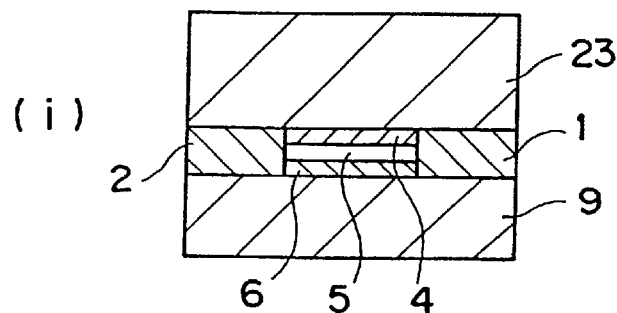
FIG. 6 are sectional views, illustrating steps of manufacturing the embodiment shown in FIG. 1.
Figure 6:
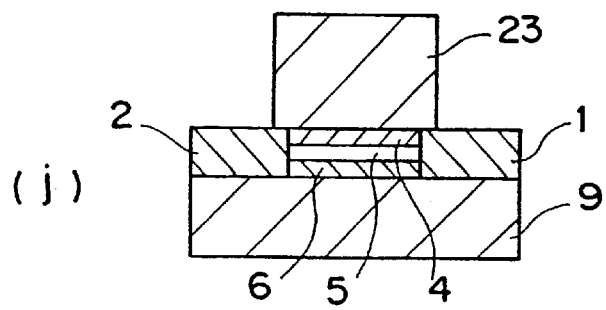
Figure 6:
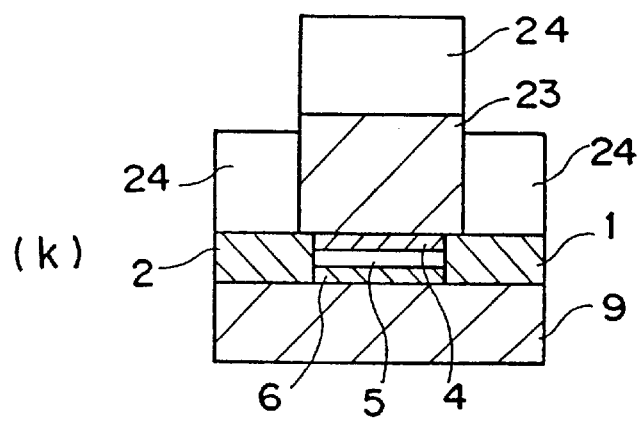
Figure 6:
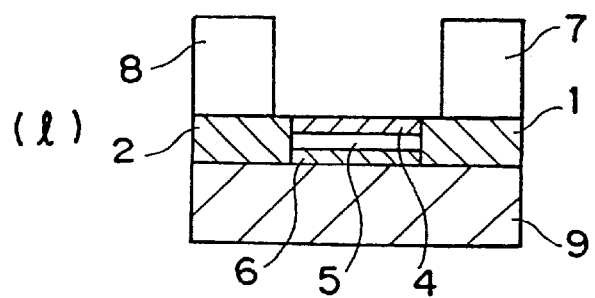

FIG. 1 is a sectional view, illustrating one embodiment of magnetoresistive element in accordance with the present invention, as described above. FIGS. 4 through 6 are sectional views, illustrating steps of manufacturing the magnetoresistive element embodiment shown in FIG. 1. Referring to FIG. 4(a), a Co layer (thickness of 5 nm) as the second ferromagnetic layer 6, a Cu layer (thickness of 2 nm) as the nonmagnetic conductive layer 5, and an $Ni_{80}Fe_{20}$ layer (thickness of 5 nm) as the first ferromagnetic layer 4 are sequentially deposited on a nonmagnetic substrate 9, typically of Si, by using an ion beam sputtering (IBS) technique.

Referring now to FIG. 4(b), applied onto the first ferromagnetic layer 4 is a resist coating 10 which is subsequently patterned, as shown in FIG. 4(c), by using a photoresist technique. The patterned resist coating 10 serves as a mask for selective etch removing of the first ferromagnetic layer 4, nonmagnetic conductive layer 5 and second ferromagnetic layer 6 by an ion beam etching (IBE) technique, so that they are microprecessed into an element form as shown in FIG. 4(d).

Referring next to FIG. 5(e), applied over an entire surface of the substrate is a resist coating 21 which is subsequently patterned by using photolithographic techniques to leave the resist coating 21 only over an entire upper surface of the multilayer film, as shown in FIG. 5(f). Then, an Fe layer 22 (thickness of 12 nm), for use as a filter layer, is deposited over an entire surface of the substrate by an IBS technique, as shown in FIG. 5(g). The resist film 21 is then lifted off to thereby remove the Fe layer 22 carried thereon, as shown in FIG. 5(h). The Fe layers left at opposite sides of the multilayer film constitute filter layers 1 and 2, respectively.

Again, a resist coating 23 is applied over an entire surface of the substrate, as shown in FIG. 6(i). The resist coating 23 is then patterned by a photolithography technique to leave its central portion, as shown in FIG. 6(j). Next, an Au layer 24 (100 m), as an electrode, is deposited over an entire surface of the substrate by an IBS technique, as shown in FIG. 6(k). The resist coating 23 is then lifted off for removal, so that the Au layers are left in a spaced apart manner to constitute electrodes 7 and 8, respectively.

In this embodiment, the layers are deposited such that a width dimension of the multilayer film, i.e., a distance between the filter layers is maintained at 500 nm.

In the coercivity differential type GMR film of such construction, the first ferromagnetic layer 4 and second ferromagnetic layer 6 may be respectively dimensioned in thickness to generally fall within the range of 10–100 A. A thickness of the nonmagnetic conductive layer 5 may be generally in the range of 10–50 Å.

The magnetoresistive element embodiment shown in FIG. 1 can be thus obtained in the manner as described above.

Figure 7:
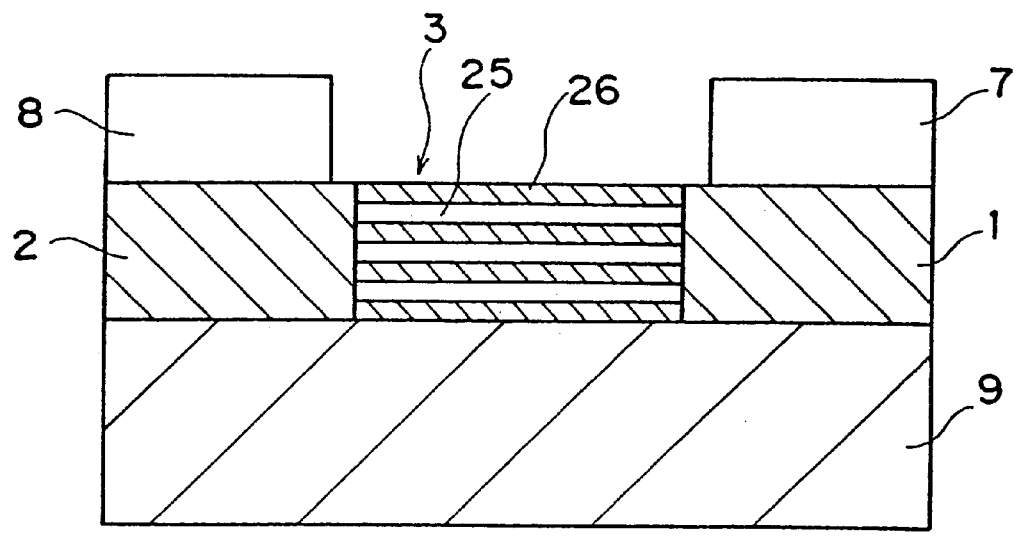
FIG. 7 is a sectional view, illustrating an alternative embodiment of magnetoresistive element in accordance with the present invention.

FIG. 7 is a sectional view, illustrating an alternative magnetoresistive element embodiment of the present invention. Referring to FIG. 7, the multilayer film 3 of this embodiment is an artificial lattice type GMR film having nonmagnetic conductive layers 25, typically of Cu, and ferromagnetic layers 26, typically of Co, repeatedly stacked in plural periodic sequences. The other components are provided in the same manner as in the embodiment shown in FIG. 1. Each nonmagnetic conductive layer 25 may be formed to a thickness of 10–50 Å, for example. Each ferromagnetic layer 26 may be formed to a thickness of 10–100 Å, for example. Also, the nonmagnetic conductive layers 25 and ferromagnetic layers 26 are repeatedly stacked at a period of 5–30 Å.

Figure 8:
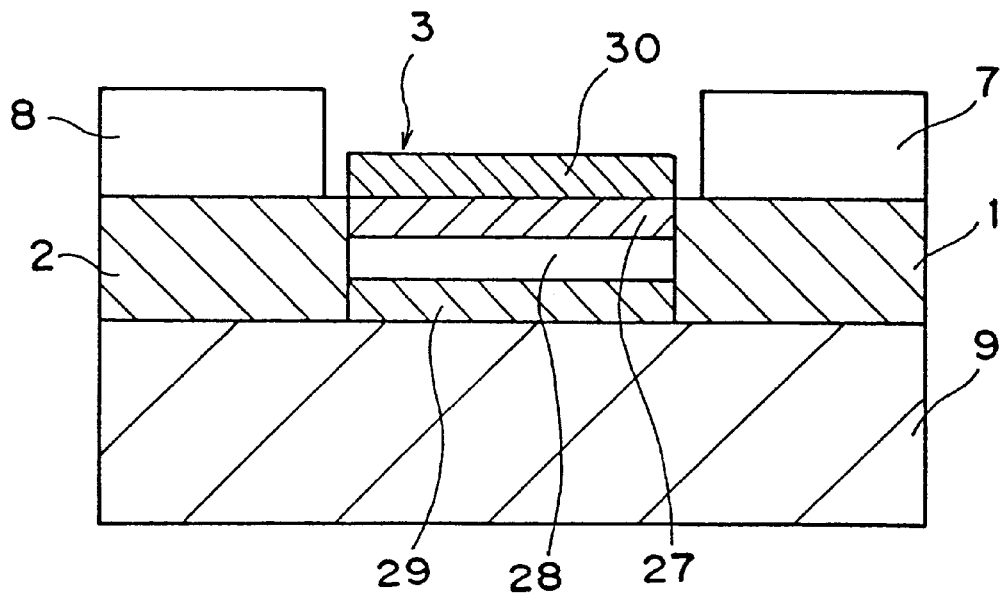
FIG. 8 is a sectional view, illustrating a further alternative embodiment of magnetoresistive element in accordance with the present invention.

FIG. 8 is a sectional view, illustrating a further alternative embodiment of the magnetoresistive element in accordance with the present invention. In this embodiment, a spin valve type GMR film is fabricated for the multilayer film 3. A dual-layer film consisting of an $Ni_{80}Fe_{20}$ layer (thickness of 5 nm) and a Co layer (thickness of 2 nm) is deposited to constitute a ferromagnetic layer 27. A Cu layer (thickness of 3 nm) is deposited to constitute a nonmagnetic conductive layer 28. A dual-layer film consisting of a Co layer (thickness of 2 nm) and an $Ni_{80}Fe_{20}$ layer (thickness of 5 nm) is deposited to constitute a second ferromagnetic layer 29. The Co layers respectively incorporated in the first ferromagnetic layer 27 and second ferromagnetic layer 29 are located adjacent to the Cu layer. Deposited on the first ferromagnetic layer 27 is an $Fe_{50}Mn_{50}$ layer (thickness of 15 nm) serving as an antiferromagnetic layer 30. Also, Fe layers (thickness of 15 nm) are deposited to constitute a filter layer 1 and a filter layer 2, respectively, so that each filter layer 1, 2 contacts with one or other lateral marginal surface of each of the first ferromagnetic layer 27, nonmagnetic conductive layer 28 and second ferromagnetic layer 29. In such a spin valve type GMR film, a thickness of the antiferromagnetic layer 30 may be generally in the range of 50–500 Å, thicknesses of the first ferromagnetic layer 27 and second ferromagnetic layer 29 generally in the range of 10–100 Å, and a thickness of the nonmagnetic conductive layer 28 generally in the range of 10–50 Å, for example.

In the present embodiment, the aforementioned layers are formed such that a width dimension of the multilayer film, i.e., a distance between the two filter layers is maintained at 500 nm.

Figure 9:
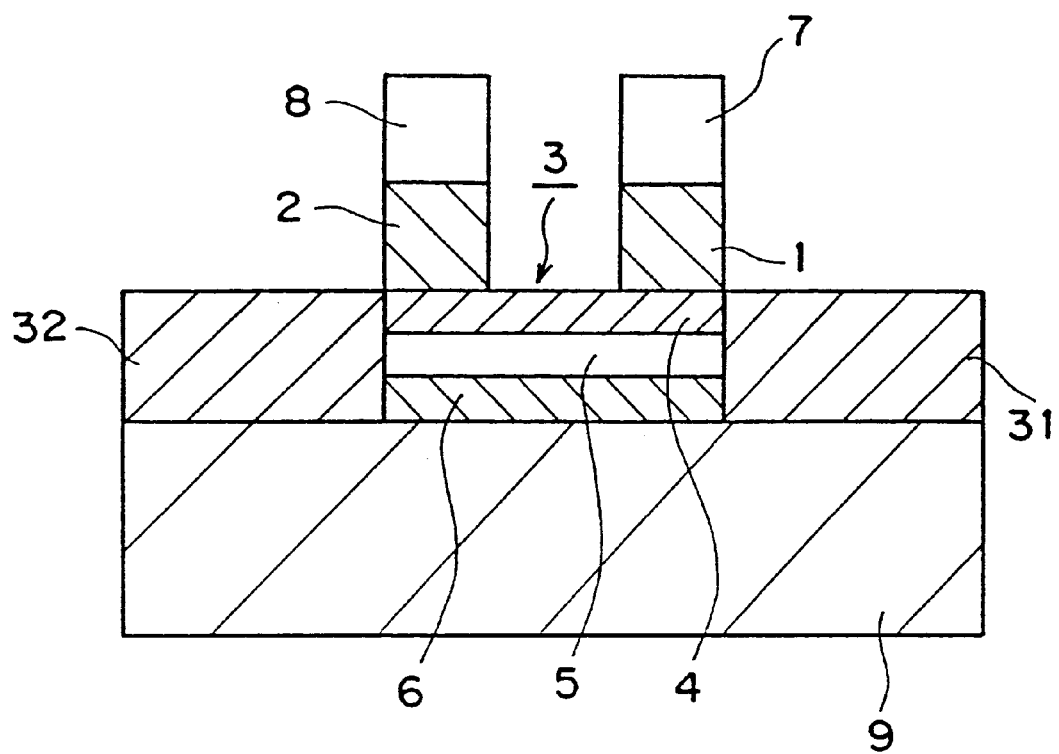
FIG. 9 is a sectional view, illustrating a still further alternative embodiment of magnetoresistive element in accordance with the present invention.

FIG. 9 is a sectional view, illustrating a still further alternative embodiment of the magnetoresistive element in accordance with the present invention. In this embodiment, a bias layer is provided. As analogous to the embodiment shown in FIG. 1, the multilayer film 3 consisting of the first ferromagnetic layer 4, nonmagnetic conductive layer 5 and second ferromagnetic layer 6 is deposited on the substrate 9. Bias layers 31 and 32, typically of CoCrPt, are deposited in respective contacts with opposite side marginal surfaces of the multilayer film 3. In such a case where each bias layer is disposed in direct contact with the multilayer film 3, the first ferromagnetic layer 4 may, for example, carry thereon a pair of filter layers 1 and 2 spaced apart by a predetermined distance, on which the respective electrodes 7 and 8, typically of Au, are deposited. This construction permits electrons to flow into the first ferromagnetic layer 4 through the filter layer 1 or 2, accordingly permits spin-polarized electrons to flow into the first ferromagnetic layer 4. As illustrated by this embodiment, the filter layers may be disposed in contact with either one of the ferromagnetic layers. The present invention does not always require the filter layers to be brought in contact with both of the first ferromagnetic layer 4 and second ferromagnetic layer 6. Also, the filter layer is permitted to locate at only one side of the ferromagnetic layer, if electrons can be delivered from that side. It is not always required that the filter layers are provided to locate at opposite sides of the ferromagnetic layer, respectively.

In this embodiment, a traveling distance of electrons in the ferromagnetic layer, i.e., a distance between the two filter layers is maintained at 500 nm.

Figure 10:
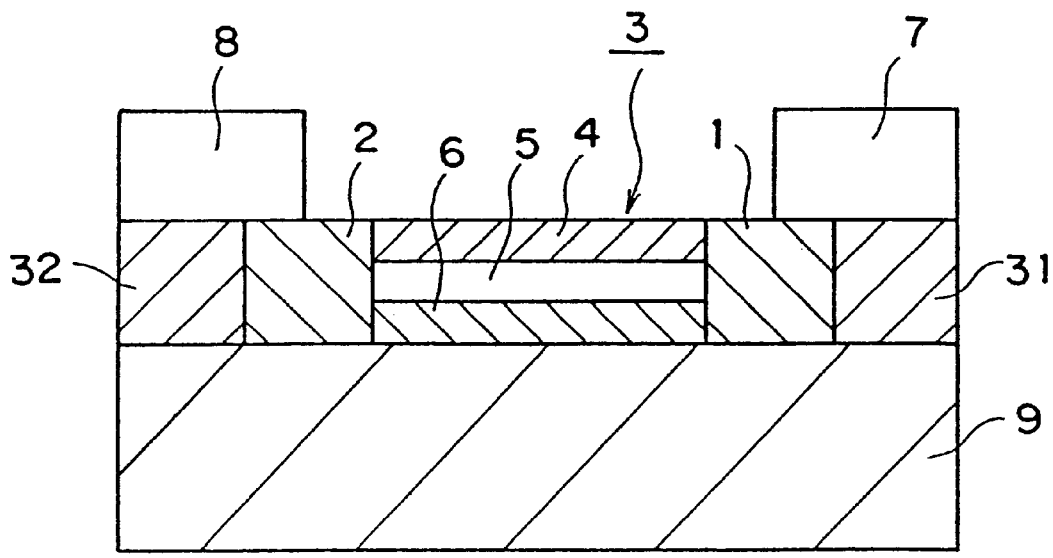
FIG. 10 is a sectional view, illustrating a still further alternative embodiment of magnetoresistive element in accordance with the present invention.

FIG. 10 is a sectional view, illustrating a still further alternative embodiment of the magnetoresistive element in accordance with the present invention. Bias layers 31 and 32 are incorporated also in this embodiment. In the present embodiment, the multilayer film 3 consisting of the first ferromagnetic layer 4, nonmagnetic conductive layer 5 and second ferromagnetic layer 6 is placed centrally on the substrate 9, as analogous to the embodiment shown in FIG. 1. The filter layers 1 and 2, typically of Fe, are disposed in contact with respective marginal sides of the multilayer film 3. The present embodiment further includes the bias layers 31 and 32, typically of CoCrPt, located outwardly of the respective filter layers 1 and 2. The electrode 7 is disposed to extend over the bias layer 31 and filter layer 1, while the electrode 8 is disposed to extend over the bias layer 32 and filter layer 2.

In this embodiment, the layers are arranged such that a width dimension of the multilayer film, i.e., a distance between the filter layers is maintained at 500 nm.

Figure 11:
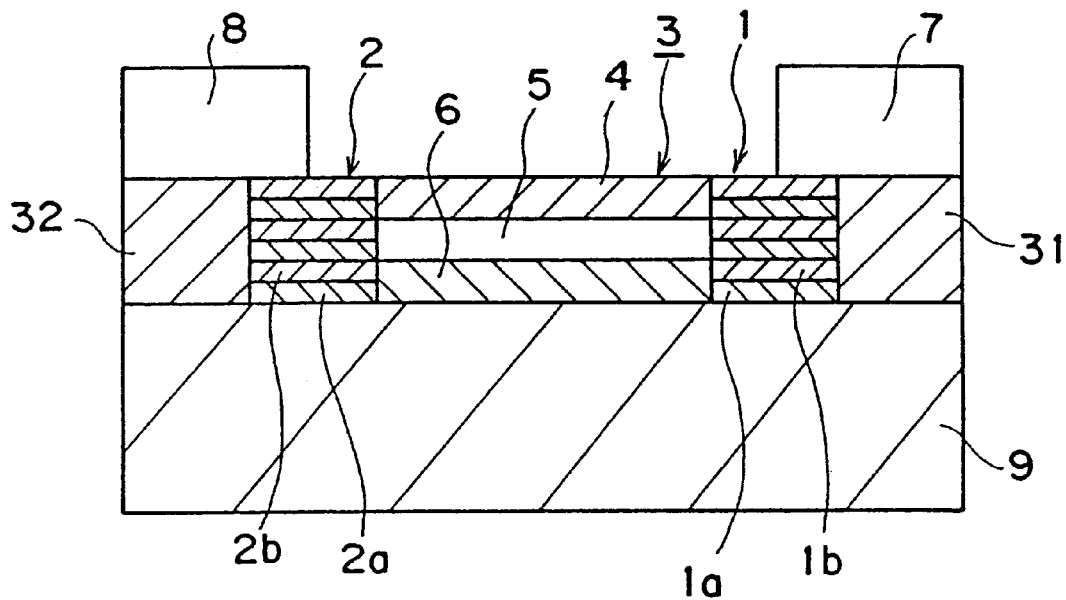
FIG. 11 is a sectional view, illustrating a still further alternative embodiment of magnetoresistive element in accordance with the present invention.

FIG. 11 is a sectional view, illustrating a still further alternative embodiment of the magnetoresistive element in accordance with the present invention. In this embodiment, each filter layer 1, 2 consists of alternatingly deposited filter layers 1a, 1b and magnetic layers 2a, 2b. The other components are provided in the same manner as the embodiment shown in FIG. 10. This illustrates that, in the present invention, different types of magnetic layers may be combined to constitute the filter layers.

In this embodiment, the layers are arranged such that a width dimension of the multilayer film, i.e., a distance between the filter layers is maintained at 500 nm.

Figure 12:
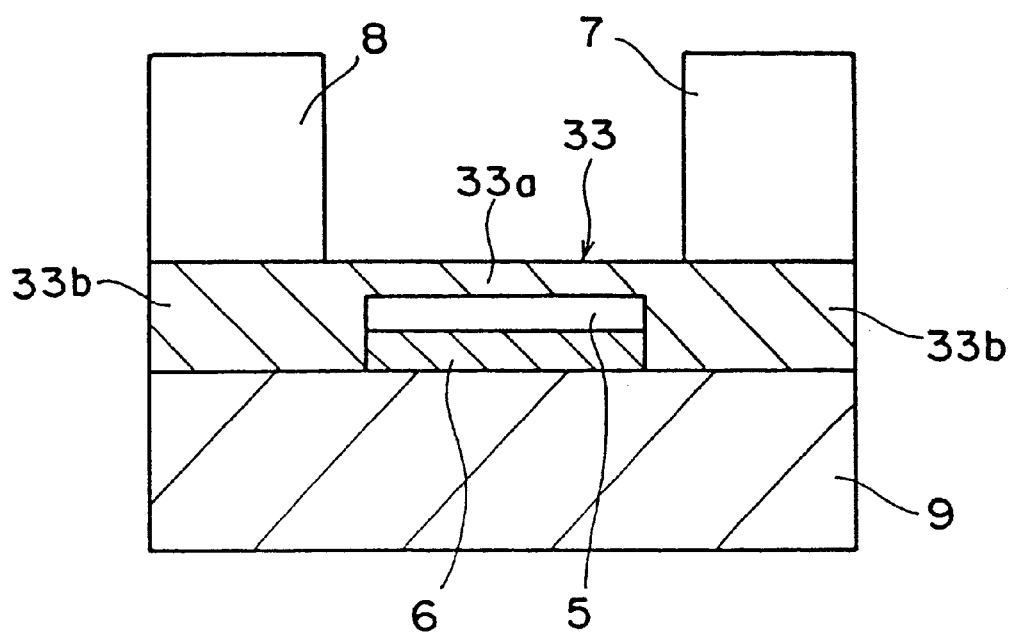
FIG. 12 is a sectional view, illustrating a still further alternative embodiment of magnetoresistive element in accordance with the present invention.

FIG. 12 is a sectional view, illustrating a still further alternative embodiment of the magnetoresistive element in accordance with the present invention. In this embodiment, a first ferromagnetic layer is continuously and integrally formed with filter layers. More specifically, the second ferromagnetic layer 6 and nonmagnetic conductive layer 5 are stacked centrally on the substrate 9, and a ferromagnetic layer 33 is disposed having a first ferro-magnetic layer portion 33a located on the nonmagnetic conductive layer 5. The ferromagnetic layer 33 further extends outwardly from respective side edges of the nonmagnetic conductive layer 5 and second ferromagnetic layer 6 to define filter layer portions 33b which contact with respective side marginal surfaces of the second ferro-magnetic layer 6. Accordingly, the first ferromagnetic layer portion 33a of the ferromagnetic layer 33 serves as the first ferromagnetic layer, and the filter layer portions 33b serve as the filter layers of the present invention. This illustrates that, in the present invention, one of the pair of ferromagnetic layers may be continuously and integrally formed with the filter layers.

In this embodiment, the layers are arranged such that a width dimension of the multilayer film, i.e., a distance between the filter layers is maintained at 500 nm.

In this embodiment, the filter layer portion 33b of the ferromagnetic layer 33 delivers spin-polarized electrons to the second ferromagnetic layer 6, so that a large MR change can be obtained on the basis of operating mechanism of the present invention as described above.

Figure 13:
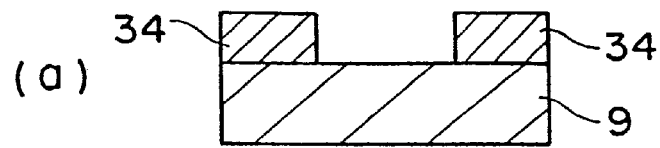
FIG. 13 are sectional views, illustrating steps of manufacturing the magnetoresistive element embodiment shown in FIG. 12.
Figure 13:
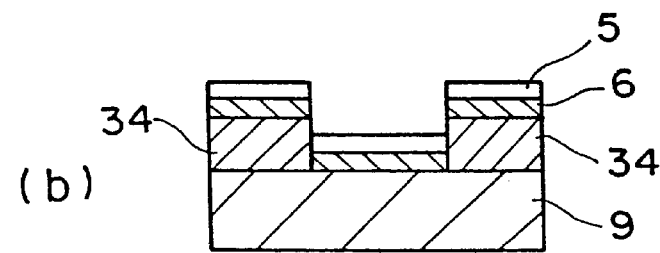
Figure 13:
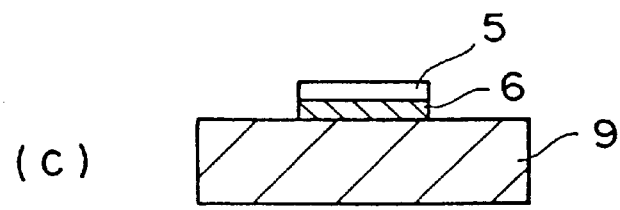
Figure 13:
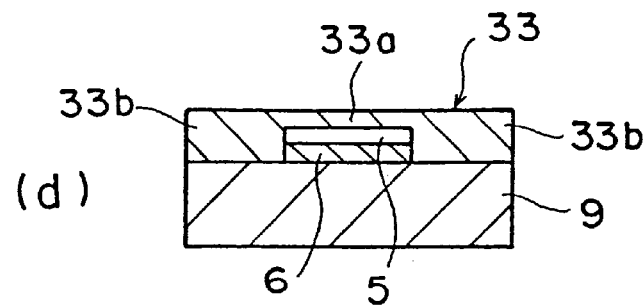
Figure 14:
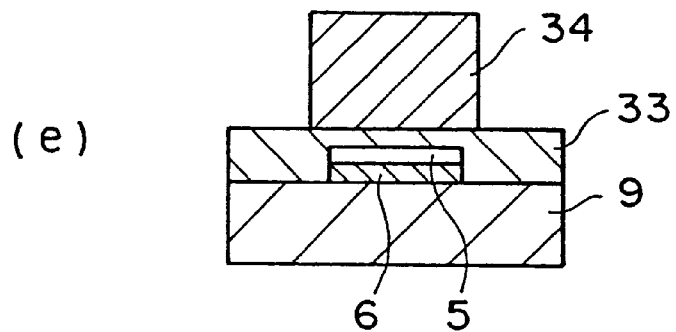
FIG. 14 are sectional views, illustrating steps of manufacturing the magnetoresistive element embodiment shown in FIG. 12.
Figure 14:
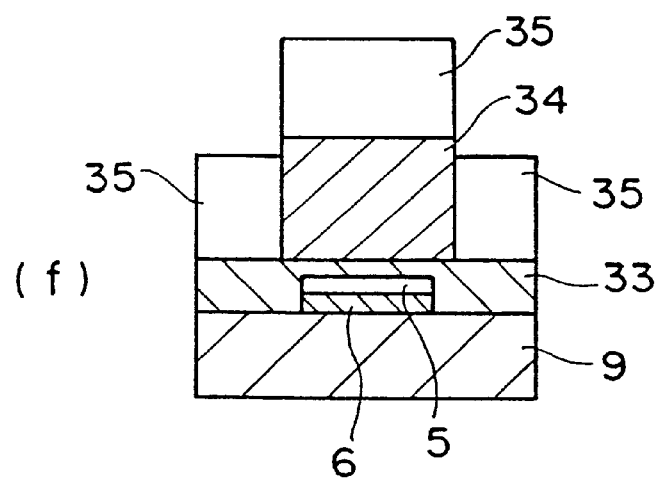
Figure 14:
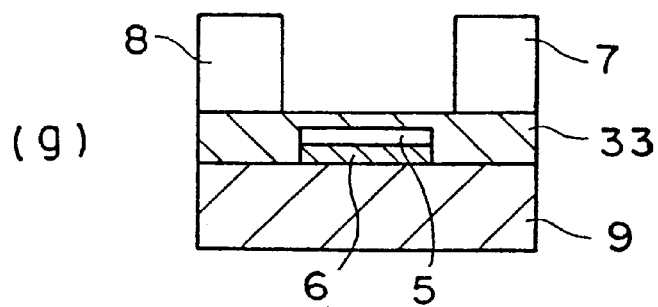
Figure 15:
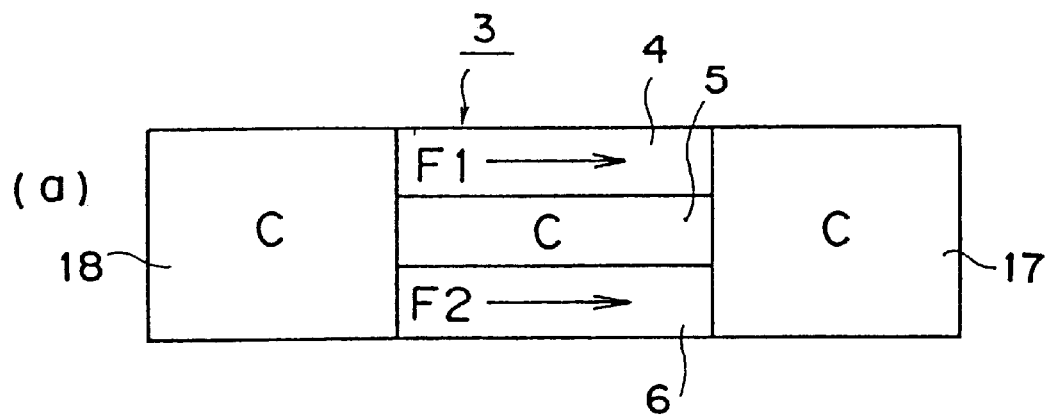
FIG. 15 are views, illustrating a spin polarization state of each layer in a conventional magnetoresistive element when a pair of ferromagnetic layers are magnetized in directions parallel to each other.
Figure 15:
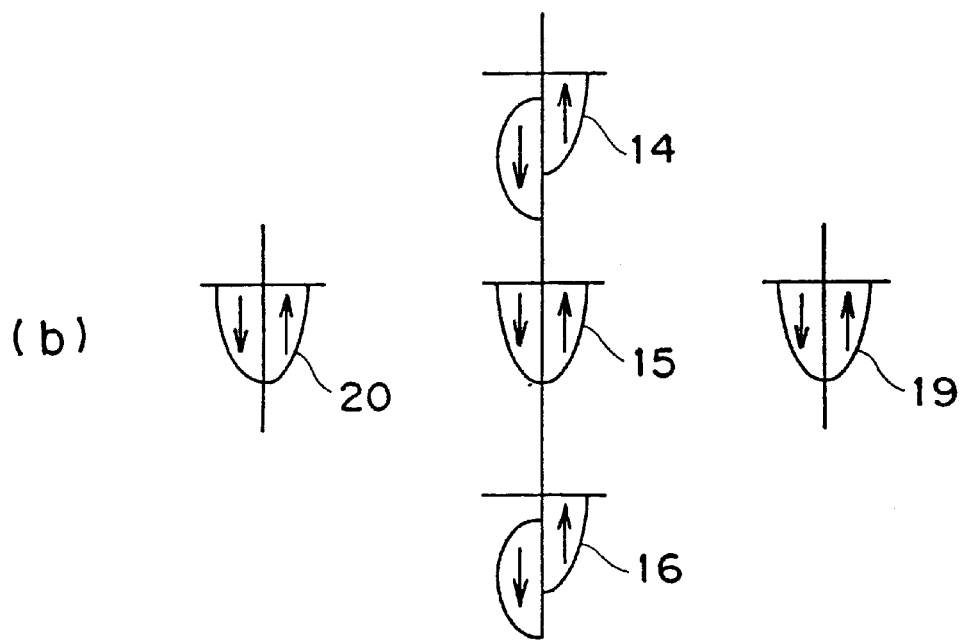
Figure 16:
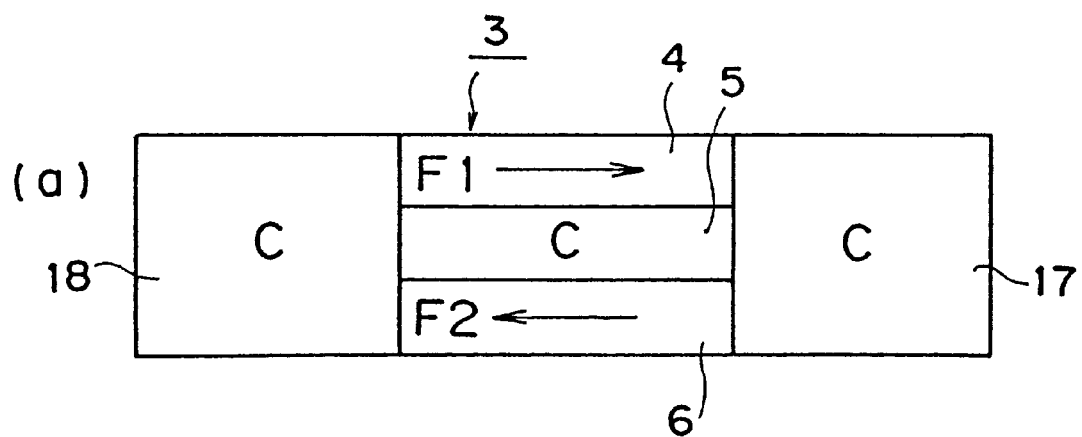
FIG. 16 are views, illustrating a spin polarization state of each layer in the conventional magnetoresistive element when the pair of ferromagnetic layers are magnetized in directions antiparallel to each other.
Figure 16:
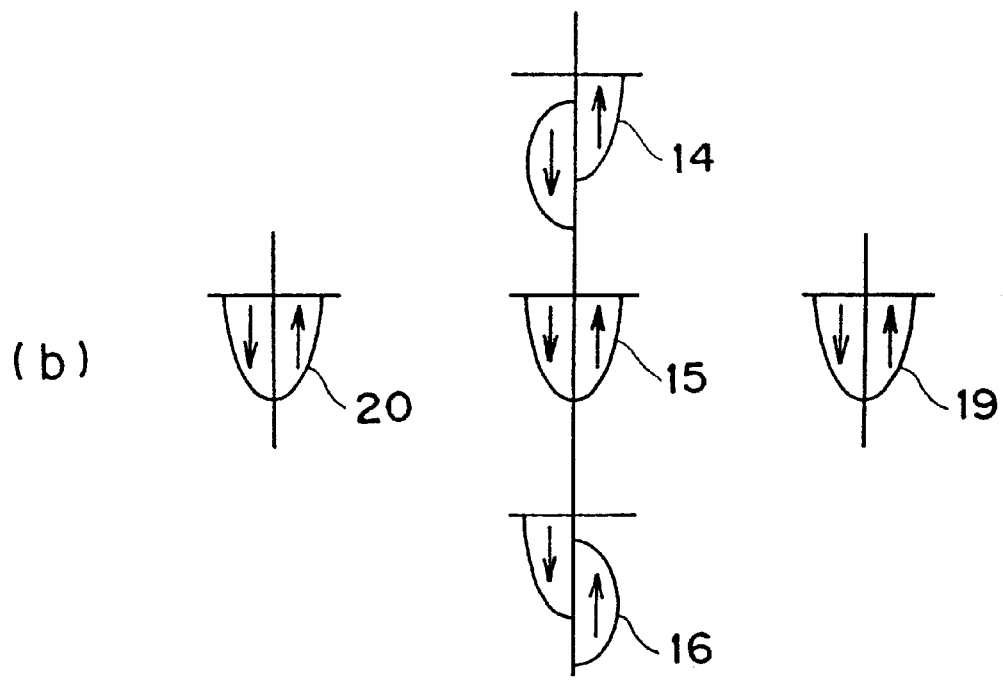

FIGS. 13 and 14 are sectional views, respectively, illustrating steps of manufacturing the embodiment shown in FIG. 12. Referring now to FIG. 13(a), a resist coating 34 is applied on the substrate 9 in a pattern to reside at opposite sides of the region in which the multilayer film is to be deposited. Then, the second ferromagnetic layer 6 and nonmagnetic conductive layer 5 are sequentially deposited over an entire surface of the substrate 9, as shown in FIG. 13(b). The resist film 34 is then lifted off so that the second ferromagnetic layer 6 and nonmagnetic conductive layer 5 remain centrally on the substrate 9, as shown in FIG. 13(c). Next, the ferromagnetic layer 33 is deposited over an entire surface of the substrate 9 to define the first ferromagnetic layer portion 33a at its portion located on the nonmagnetic conductive layer 5, as well as the filter layer portions 33b at its opposite side portions interposing therebetween the nonmagnetic conductive layer 5 and second ferromagnetic layer 6, as shown in FIG. 13(d). The second ferromagnetic layer 6, nonmagnetic conductive layer 5 and ferromagnetic layer 33 may, for example, be comprised of a Co layer, a Cu layer and an $Ni_{80}Fe_{20}$ layer, respectively.

Then, a resist coating 34 is deposited in a pattern to reside centrally on the ferromagnetic layer 33, as shown in FIG. 14(e), followed by deposition of an Au layer 35 over an entire surface of the substrate 9, as shown in FIG. 14(f). The resist coating 34 is subsequently lifted off, so that the Au layers left in a spaced apart manner define electrodes, respectively, as shown in FIG. 14 (g).

The magnetoresistive element embodiment in accordance with the present invention, as shown in FIG. 12, can thus be manufactured in the manner as described above.

CAPABILITY OF EXPLOITATION IN INDUSTRY

In accordance with the present invention, a high-sensitive magnetoresistive element is obtained which can exhibit a large MR change than conventional. The magneto-resistive element of the present invention can be used, for example, as an MR head suitable for high density recording.

What is claimed is:

1. A magnetoresistive element comprising a multilayer film having a multilayer structure in which a nonmagnetic conductive layer is interposed between a pair of ferromagnetic layers, a pair of electrodes which produces a detection current flow through the multilayer film, and a filter layer comprised of ferromagnetic material and disposed between a positive one of said pair of electrodes and one of said pair of ferromagnetic layers for delivering spin-polarized electrons to said ferromagnetic layer, wherein a traveling distance of electrons in the ferromagnetic layer is maintained shorter than a spin diffusion length, and wherein said ferromagnetic material of the filter layer is selected, so that a difference in Fermi level between the filter layer and the ferromagnetic layer falls within a range of ±1 eV.

2. The magnetoresistive element as recited in claim 1, wherein said traveling distance of electrons in the ferromagnetic layer is 1 µm–0.05 µm.

3. The magnetoresistive element as recited in claim 1, wherein said multilayer film is a coercivity differential type magnetoresistive film and said pair of ferromagnetic layers have coercive forces different in magnitude from each other.

4. The magnetoresistive element as recited in claim 1, wherein said multilayer film is a spin valve type magnetoresistive film and an antiferromagnetic layer is deposited on one of said pair of ferromagnetic layers.

5. The magnetoresistive element as recited in claim 1, wherein said multilayer film is an artificial lattice type magnetoresistive film and wherein said ferromagnetic and nonmagnetic conductive layers are stacked repeatedly in plural periodic sequences.

6. The magnetoresistive element as recited in claim 1, wherein said filter layer is arranged to contact with each layer of said multilayer film.

7. The magnetoresistive element as recited in claim 1, wherein said filter layer is arranged to contact with only one of said pair of ferromagnetic layers.

8. The magnetoresistive element as recited in claim 1, wherein said filter layer is arranged to contact with one of said pair of ferromagnetic layers and integrally formed with the other of the pair of ferromagnetic layers.

9. A magnetoresistive element comprising a multilayer film having a multilayer structure in which a nonmagnetic conductive layer is interposed between a pair of ferromagnetic layers, a pair of electrodes which produces a detection current flow through the multilayer film, and a filter layer comprised of ferromagnetic material and disposed between a positive one of said pair of electrodes and one of said pair of ferromagnetic layers for delivering spin-polarized electrons to said ferromagnetic layer, wherein a traveling distance of electrons in the ferromagnetic layer is maintained shorter than a spin diffusion length, wherein said multilayer film is an artificial lattice type magnetoresistive film, and wherein said ferromagnetic and nonmagnetic conductive layers are stacked repeatedly in plural periodic sequences.

10. A magnetoresistive element comprising a multilayer film having a multilayer structure in which a nonmagnetic conductive layer is interposed between a pair of ferromagnetic layer, a pair of electrodes which produces a detection current flow through the multilayer film, and a filter layer comprised of ferromagnetic material and disposed between a positive one of said pair of electrodes and one of said pair of ferromagnetic layers for delivering spin-polarized electrons to said ferromagnetic layer, wherein a traveling distance of electrons in the ferromagnetic layer is maintained shorter than a spin diffusion length, and wherein said filter layer is arranged to contact with one of said pair of ferromagnetic layers and integrally formed with the other of the pair of ferromagnetic layers.

* * * * *

UNITED STATES PATENT AND TRADEMARK OFFICE
CERTIFICATE OF CORRECTION

PATENT NO. : 6,104,275

DATED : August 15, 2000

INVENTOR(S) : MAEDA

It is certified that error appears in the above-identified patent and that said Letters Patent is hereby corrected as shown below:

On the title page,
Item [30], please delete--6-249437 and insert--8-249437.

Signed and Sealed this

Twenty-fourth Day of April, 2001

Attest:

NICHOLAS P. GODICI

*Attesting Officer*   *Acting Director of the United States Patent and Trademark Office*